United States Patent
Mohtasham et al.

(10) Patent No.: US 9,188,646 B2
(45) Date of Patent: Nov. 17, 2015

(54) INTERLOCK SWITCH CIRCUIT WITH SINGLE FAULT DETECTION

(71) Applicant: Idem Safety Switches Limited, Wigan (GB)

(72) Inventors: Medi Mohtasham, Manchester (GB);
Hamed Faridfar, Manchester (GB);
Vincent Crolla, Warrington (GB);
Timothy Jennings, Manchester (GB)

(73) Assignee: Idem Safety Switches Limited (GB)

( * ) Notice: Subject to any disclaimer, the term of this patent is extended or adjusted under 35 U.S.C. 154(b) by 171 days.

(21) Appl. No.: 13/853,003

(22) Filed: Mar. 28, 2013

(65) Prior Publication Data

US 2013/0285666 A1 Oct. 31, 2013

(30) Foreign Application Priority Data

Mar. 30, 2012 (GB) .................. 1205746.9

(51) Int. Cl.
*G01R 31/327* (2006.01)
*H01H 9/22* (2006.01)

(52) U.S. Cl.
CPC .............. *G01R 31/327* (2013.01); *H01H 9/22* (2013.01); *H01H 2300/052* (2013.01)

(58) Field of Classification Search
CPC ............. H01H 9/20; H01H 9/22; H01H 9/24; H01H 9/16; H01H 9/161; H01H 2300/052; H01H 47/002; H01H 47/004; H01H 47/005; G01R 31/025; G01R 31/026; G01R 31/08; G01R 31/088; G01R 31/2805; G01R 31/327; G01R 31/3275
USPC ................... 324/415, 418; 361/160, 166, 728
See application file for complete search history.

(56) References Cited

U.S. PATENT DOCUMENTS

| | | | |
|---|---|---|---|
| 2002/0175568 A1* | 11/2002 | Clement et al. ............... | 307/326 |
| 2003/0011250 A1* | 1/2003 | Pullmann et al. ............. | 307/326 |
| 2003/0058623 A1* | 3/2003 | Veil et al. ...................... | 361/728 |
| 2006/0209488 A1* | 9/2006 | Papenbreer ................... | 361/160 |
| 2007/0091518 A1* | 4/2007 | Pullmann et al. .............. | 361/23 |
| 2009/0189612 A1* | 7/2009 | Mills et al. .................... | 324/424 |
| 2011/0268455 A1* | 11/2011 | Lorenz et al. ................. | 398/140 |
| 2012/0243139 A1* | 9/2012 | Jones et al. ................... | 361/166 |

* cited by examiner

*Primary Examiner* — Huy Q Phan
*Assistant Examiner* — David Frederiksen
(74) *Attorney, Agent, or Firm* — Quarles & Brady LLP; Gavin J. Milczarek-Desai

(57) ABSTRACT

A testing system to test safety interlock switches to ensure that they are operating normally comprising a test loop circuit 16 which connects in series a plurality of safety switches 2, the test loop circuit 16 is adapted to open the switches 2 outputs if broken, the testing system further comprising a diagnostic means 18 which checks each switch to ensure it is operating normally when the test loop circuit 16 is broken. The test loop circuit 16 may be broken when a single switch 2 is activated to open its safety output.

13 Claims, 2 Drawing Sheets

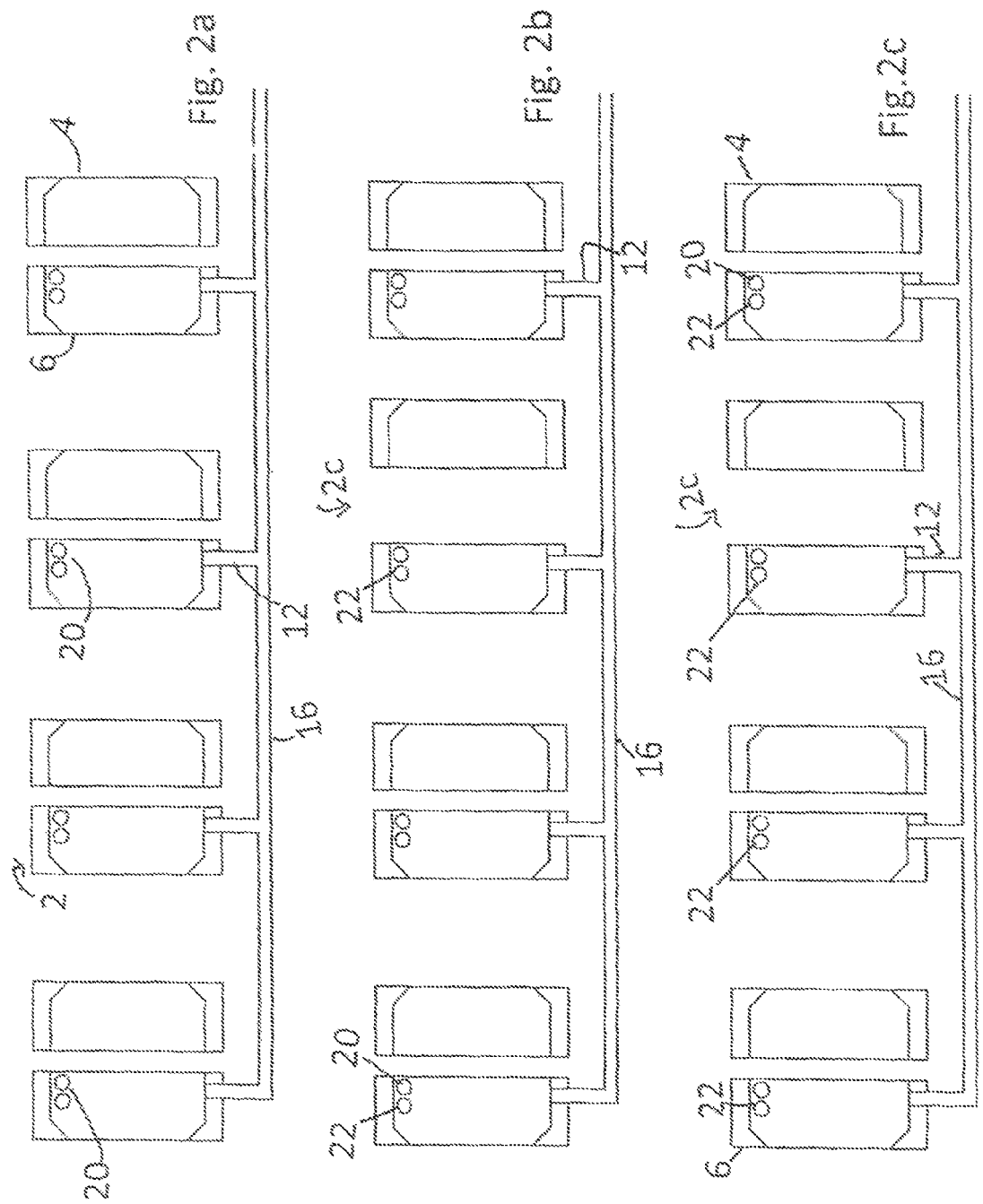

INTERLOCK SWITCH CIRCUIT WITH SINGLE FAULT DETECTION

Figure 1:
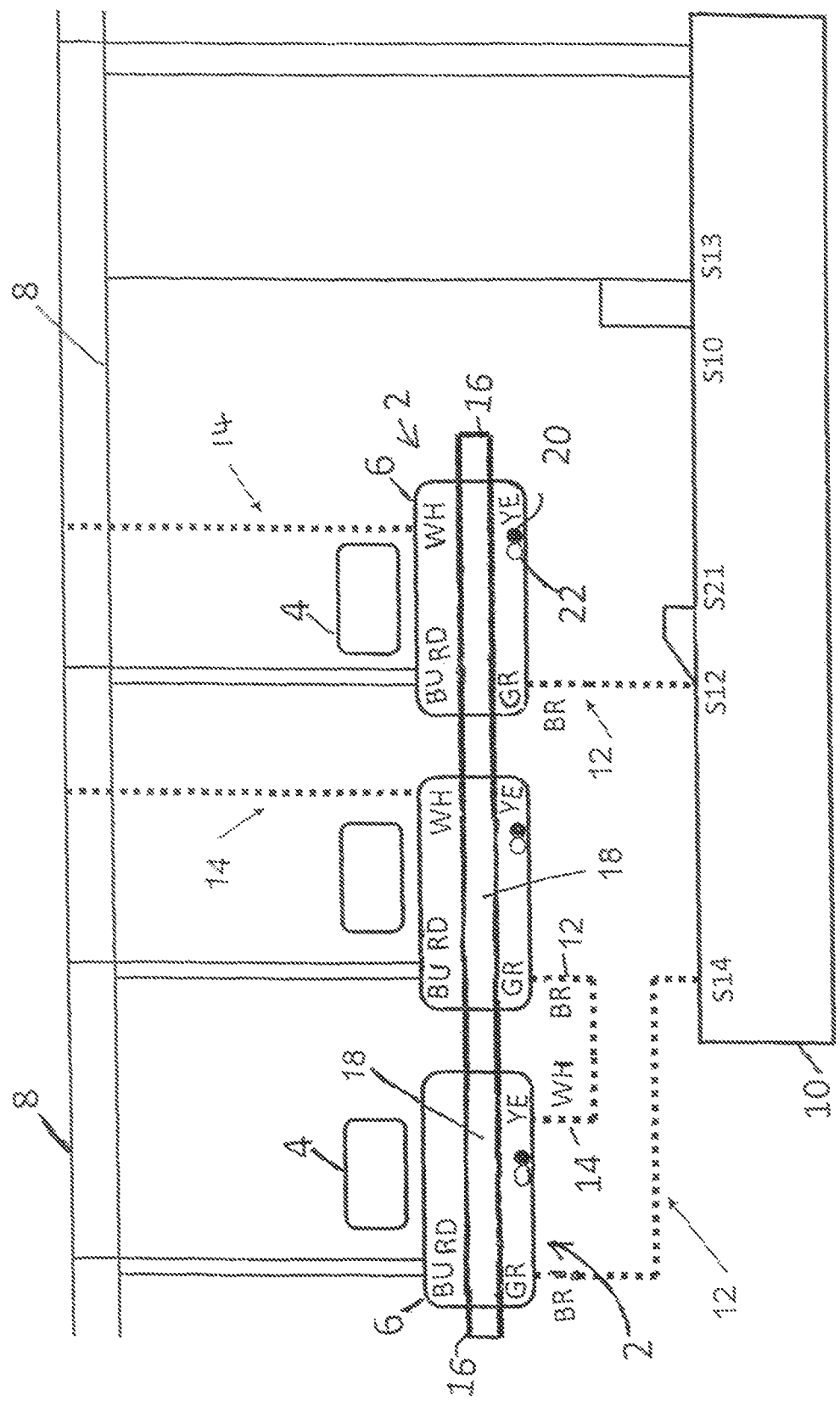

The present invention relates to a testing system to test safety interlock switches to ensure they are operating normally and in particular a system which enables easy testing of a plurality of such switches.

Access to hazardous machinery is blocked by guards. An interlock switch is used to monitor the position of the guard. Power to the machinery is controlled through the interlock switch such that when the guard is opened the condition of the switch is altered and power is cut in order to enable safe access to the machine. When the guard is closed, the power supply is resumed. The problem is that if the switch fails, or is tampered with (overridden) by personnel desiring easier access to the machine, it is possible to open the guard without the machine powering down which gives rise to a safety hazard.

To this end it is necessary to periodically test individual switches to ensure that when its respective guard is opened, power to the machinery is cut. It is possible to do this manually by opening the guard and observing that the machine powers down. However, many such guards and associated interlocks may be provided some of which may be in hard to reach positions. Individual testing of the switches is therefore time consuming, not only for the individual conducting the test whilst each door must be individually opened and closed; but this also results in considerable down time for the machinery guarded. In this respect, this type of testing may be infrequently conducted and certain guards, which are little used or are in hard to reach locations, may be missed during the test. This leads to a potential safety issue in that a failure may not be timely detected. Also the frequent stop/start of the machine during testing may lead to damage thereof.

Complex automated test systems have been developed to test the switches on mass. They are adapted such that if a single fault is detected, the machine is stopped. In a known system each switch is connected in series, such that each switch output provides the input to the next switch. Irrespective of whether a particular switch has been opened by a machine guard opening, a test signal is circulated through the switches in order to check that the input to output of every switch is operating. This is achieved by briefly opening and closing each switch. This has the disadvantage of causing a disruption to the power supply. The test signal is usually of a 30 second duration.

Whilst this test may be more frequently conducted, this does not alleviate the problem of stopping and starting the machine in order to conduct the test. Also, the complex equipment may require several dedicated components for example a communication bus, microprocessor and hardwiring to power supply and controller. If a problem occurs, it may prove necessary to replace the entire testing system. Also, the system only tests interlock switches and not other associated safety devices for faults, such as emergency stop switches, safety mats etc. Also, this type of test may not detect a fault which occurs on the opening or closing of the interlock prior to test signal being applied. Therefore, a guard with a defective interlock may be opened prior to the test signal being applied and a corresponding safety issue arise.

It is an object of the present invention to provide a safety circuit for a plurality of interlock switches which overcomes or alleviates the foregoing drawbacks.

In accordance with the present invention there is provided a testing system to test a plurality of series connected safety switches to ensure they are operating normally, each safety switch having a safety output which when closed enables a power supply, wherein the testing system comprises a test loop circuit which connects the switches in series and which opens the switches safety outputs if broken, and wherein diagnostic means is provided which conducts a check of each switch to ensure that it is operating normally and which is activated when the test loop is broken.

In a preferred embodiment the test loop must be intact for the switches safety outputs to be closed.

The safety loop may be broken when an individual switch is activated to open its safety output.

The diagnostic may include opening and closing the switch when the power is disabled.

The diagnostic means may be adapted to ensure that the safety loop cannot be re-established if a fault is detected.

The detected fault may be that at least one of the switches safety outputs remains closed.

A diagnostic means may be provided on each switch to perform a self check of that switch.

The safety loop circuit may be broken when a fault is detected.

The testing system may include indicating means to indicate the condition of the switch. The indicator means may include at least one of the conditions switch open, switch closed, switch test diagnostic completed and switch operating normally and switch diagnostic completed and switch faulty. An indicator means may be provided on each switch to provide an indication of the condition of that switch.

By way of example only specific embodiments of the invention will now be described with reference to the accompanying drawings, in which:

FIG. 1 is a schematic view of a testing circuit of the present invention used to provide a diagnostic capability to a plurality of series connected safety switches; and FIG. 2a-2c are illustrations of fault detection sequences using the test circuit of FIG. 1.

In the example of FIG. 1, a plurality of safety switches 2 are provided. In this illustration, the switch 2 is a non-contact sensor style interlock in which the actuator 4 thereof is mounted to a guard (not shown) and the main switch body 6 to the frame of the guard. When the guard is opened, the change of position of the actuator 4 is detected by the switch body 6 and the switch 2 changes its operating condition. This type of switch 2 is designed to be on when the guard is closed to prevent access to machinery; the on condition of the switch 2 enabling a power supply to the machine. The switch 2 is designed to switch off when the guard is opened, thereby disabling the power and by such the guarded machine powers down.

Each switch 2 is connected to a power rail 8 and are also connected directly or indirectly to a monitoring controller 10 via an electronic safety output 12. When the operating condition of an individual switch 2 is altered, a signal is sent to the monitoring controller 10 through the safety output 12 which acts to enable or disable power to the machine, when the switch 2 is respectively closed and opened. Each switch 2 also has a safety input 14 which connects the switch 2 either directly or indirectly to the power rail 8.

The switches 2 are connected in series by an internal test loop 16. Each switch 2 is also provided with an individual diagnostic capability in the form of a microprocessor 18. The test loop interconnects the devices and enables a signal to transmit around the devices to conduct a self test and prevent machine restart if a fault is detected.

The internal test loop 16 is not connected to the power line 8 or to the monitoring controller 10. The test loop 16 is a continuous loop which needs to stay connected through all switches 2 it connects for the safety output 12 from each switch 2 to operate.

The test loop 16 if broken, a signal is sent which causes the safety output 12 to open on all switches 2, thereby stopping the machine. This creates an instant open/closed check of all switches 2 whilst the machine is stopped. This is achieved by triggering each switch's microprocessor to perform a self diagnostic check.

If an individual switch 2 is opened, then the safety output 12 from that switch 2 will open and also cause the loop 16 to break. The switch's on board microprocessor 18 monitors the switch condition and in turn sends a signal through the loop 16 which causes all other switch outputs 12 to open; the respective switch's output 12 being controlled by its own microprocessor 18. When the open switch 2 is once again closed, its safety output 12 is closed and a signal is sent through the loop 16 to close the safety outputs of the other switches. Thereby power is once again enabled.

Each switch 2 is provided with an indicator 20, 22 to show the operational status of each switch 2, in this example in the form of two coloured LED's. The green LED 20 indicates that the switch 2 is on and operating normally. The second LED 22 can change colour, when yellow is shown, it indicates that the individual switch is open and operating within normal parameters.

The yellow also indicates that the self diagnostic has been performed and that the switch is operating normally.

Yellow is also used in conjunction with green to indicate that an unopened switch has been checked and that it is working normally. In this instance, both LEDs are lit.

As mentioned above, the LED 22 can show two conditions and when it flashes red, whether or not it is opened, this indicates that this particular switch has developed a fault.

The onboard microprocessor controls the indicator based on the detected condition of the switch when it performs its diagnostic.

Also, if a fault condition is detected during the diagnostic, the microprocessor 18 acts to prevent the safety output 12 of the effected switch 2 from being re-established. Therefore the internal test loop 16 cannot be closed and the machine cannot be restarted.

An example of this operation is given in FIG. 2. In FIG. 2*a*, all the switches 2 are closed, the machine is running. The green LED 20 on each switch is lit, the yellow LED 22 is switched off.

In FIG. 2*b*, one of the switches 2*c* has been opened. On the opened switch 2*c*, the green LED 20 is not lit, the yellow LED 22 is lit to indicate that the switch has been checked and is in working order. The remaining unopened switches 2 have both LED lit, the green LED 20 to show that it is closed and the yellow LED 22 shown that the diagnostic has been performed and that it is in working order. In this condition, there are no faults, the safety outputs 12 can be switched on, the test loop 16 can be once again completed and the machine restarted when the open switch 2*c* is closed.

In FIG. 2*c*, a fault has been found on an unopened switch 2*b*. The remaining switches have the condition and LED status as described with respect to condition described in FIG. 2*b*. However, on the switch 2*b* on which a fault has been detected during its self diagnostic, the switch LED 22 shows a flashing red light to indicate that a fault has been found. The switches on-board microprocessor 18 will not allow that switch's safety output 12 to switch on, therefore the test loop 16 cannot be completed and the machine cannot be restarted.

This multiple turn off of every switch in series reduces the chance of a dangerous failure. In addition to the switch which has been opened, all switch outputs 12 turn off. The internal test loop 16 is broken, not only by a normal opening of a switch 2, but any breaks in the loop 16 at any safety demand.

This enables true safety demand testing which is achieved with no timed pulse-check. Each safety switch 2 is checked when access to the machine is required. This reduces significantly the risk of, for example, an undetected short circuit due to the test time frequency of previous systems.

The true safety demand testing is achieved because of breakage of the internal test loop 16 causing:

a) an immediate opening of the safety output 12 on every switch in series irrespective of the number of switches; and b) an immediate open/close check of each switch output whilst the machine is stopped. This eliminates any need to periodically manually check the switches for correct operation. Also, the test is less inconvenient because the test is conducted when the machine is in any case in a powered down condition, rather than when in a powered condition. Thereby eliminating disruption to the machines normal working in order for safety checks to be conducted.

Each safety switch acts as a standalone device after the safety demand has taken place. The advantage of this is that an individual switch with a fault can be quickly replaced and the machine restarted. This eliminates the need for extensive rewiring, or even replacement of the complete safety circuit.

Whilst LED indicators have been described, other types of indicators could be provided.

It is to be understood that although a simple switch incorporating sensor technology is used in this specific example, other types of interlock switches are intended to be covered such as non-contact sensor switch with coded sensor technology tongue operated interlock switched, interlocks with or without guard locks, together with other safety devices used to disable the power to the machine when access thereto is required, for example emergency stop buttons, pressure mats etc. Furthermore, a mixture of switches of different technologies may be connected by the test loop. The switch in question to be suitable for inclusion merely requiring a change of operating conditions when used to start and restart the machinery, which is detectable by a self diagnostic in order that a fault therein can be detected. This enables a plurality of safety devices to be tested individually when the machine is stopped by means of a self diagnostic.

The invention claimed is:

1. A testing system to test a plurality of series connected safety switches to ensure they are operating normally, each safety switch having a safety output which when closed enables a power supply, characterized in that the testing system comprises an individual diagnostic means on each switch to perform a self check of that switch and which controls that switch's safety output, and a test loop circuit which connects the diagnostic means in series and which is adapted to send a signal to each diagnostic means to open its switch's safety output if any one safety switch is activated to open its respective safety output, and wherein each diagnostic means is also adapted to check its switch to ensure that it is operating normally and which is activated when the test loop circuit sends said signal.

2. A testing system according to claim 1, wherein the test loop circuit must be intact for the switches safety outputs to be closed.

3. A testing system according to claim 1, wherein the diagnostic includes opening and closing the switches when the power supply is disabled.

4. A testing system according to any claim 1, wherein the diagnostic means is adapted to ensure that the power supply cannot be re-established if a fault is detected in at least one switch.

5. A testing system according to claim 4, wherein the detected fault is that at least one of the switches safety outputs remain closed.

6. A testing system according to claim 1, wherein the test loop circuit cannot be re-established if a fault is detected by a diagnostic means.

7. A testing system according to claim 1, wherein the testing system includes indicating means to indicate the condition of the switch.

8. A testing system according to claim 7, wherein the indicator means indicates at least one of the conditions switch open, switch closed, switch test diagnostic completed and switch operating normally, and switch diagnostic completed and switch faulty.

9. A testing system according to claim 1, wherein an indicator means is provided on each switch to provide an indication of the condition of that switch.

10. A method of testing a plurality of series connected safety switches to ensure they are operating normally, each safety switch having a safety output which when closed enables a power supply, characterized in that each safety switch has an individual diagnostic means which control its safety output, and in a test loop circuit which connects the individual diagnostic means in a continuous loop, the method comprising the steps of changing the condition of an individual safety switch by attempting to open its safety output, activating that individual switch's diagnostic means by said change in condition, said individual switch's diagnostic means then sending a signal round the test loop to the other switch's individual diagnostic means to instruct them to perform a self-check, and each individual diagnostic means then conducting a self check of its safety switch to ensure it is operating normally.

11. A method according to claim 10, wherein if a fault in a safety switch is detected that switches diagnostic means sends a signal round the test loop to prevent power being enabled.

12. A method according to claim 11, wherein the detected fault is that the switches safety output remains closed.

13. A method according to claim 10, wherein each safety switch has indicating means to show the condition of the switch to indicate at least one of the conditions switch open, switch closed, switch test diagnostic completed and switch operating normally, and switch diagnostic completed and switch faulty.

* * * * *